US009491327B2

(12) United States Patent
Nakazawa et al.

(10) Patent No.: US 9,491,327 B2
(45) Date of Patent: Nov. 8, 2016

(54) PHOTOELECTRIC CONVERSION ELEMENT, IMAGE READING DEVICE, AND IMAGE FORMING APPARATUS

(71) Applicants: Masamoto Nakazawa, Kanagawa (JP); Tohru Kanno, Osaka (JP)

(72) Inventors: Masamoto Nakazawa, Kanagawa (JP); Tohru Kanno, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/847,038

(22) Filed: Sep. 8, 2015

(65) Prior Publication Data
US 2016/0088179 A1 Mar. 24, 2016

(30) Foreign Application Priority Data
Sep. 19, 2014 (JP) ................ 2014-191963

(51) Int. Cl.
H04N 1/03 (2006.01)
(52) U.S. Cl.
CPC ........ *H04N 1/03* (2013.01); *H04N 2201/0081* (2013.01); *H04N 2201/0094* (2013.01)
(58) Field of Classification Search
CPC .......... H04N 2201/0081; H04N 1/1013; H04N 1/193; H04N 5/372; H04N 1/40056; H04N 5/3765; H04N 5/378; H04N 1/00928; H04N 1/00933; H04N 5/3682; H04N 1/02815; H04N 1/0473; H04N 1/1039; H04N 5/335
USPC ....... 358/474, 475, 482, 445, 483, 443, 446, 358/497, 505, 1.13, 448, 488, 509, 513; 250/208.1, 208.2, 214 DC, 214 R; 327/108, 156, 109, 333; 348/E5.091, 348/E5.062, 207.99, 222.1, 243, 294, 300, 348/308, 312, 571, 572; 315/291; 326/61, 326/80; 375/130, 376; 382/275; 455/108; 713/500
See application file for complete search history.

(56) References Cited

U.S. PATENT DOCUMENTS 5,408,113 A 4/1995 Kanno et al.
6,198,349 B1 3/2001 Kanno et al.
(Continued)

FOREIGN PATENT DOCUMENTS

EP 2 618 376 A2 7/2013
JP 2002-170944 6/2002
(Continued)

OTHER PUBLICATIONS

U.S. Appl. No. 14/745,967, filed Jun. 22, 2015.
(Continued)

*Primary Examiner* — Negussie Worku
(74) *Attorney, Agent, or Firm* — Oblon, McClelland, Maier & Neustadt, L.L.P.

(57) ABSTRACT

A photoelectric conversion element comprises: a plurality of photodetectors that perform photoelectric conversion per pixel to output an analog image signal, and that are arranged on a straight line; and wirings that are formed on a wiring layer, and that are enabled to be used as at least one of a signal line used in a peripheral circuit of the photodetector, a power source, and a ground, wherein the photodetector is formed to have a first shaded region and a second shaded region in which light is shaded by the wirings that are positioned on the straight line sandwiching an opening, respectively, when light that has passed through the opening that opens being sandwiched by the wirings positioned on the straight line is incident perpendicularly on a light receiving surface of the photodetector.

10 Claims, 18 Drawing Sheets

(56) References Cited

U.S. PATENT DOCUMENTS

| | | | |
|---|---|---|---|
| 6,551,445 B1* | 4/2003 | Yokogawa et al. | H01J 37/32678 118/723 E |
| 6,995,800 B2 | 2/2006 | Takahashi et al. | |
| 7,280,146 B2 | 10/2007 | Takahashi et al. | |
| 7,800,191 B2 | 9/2010 | Ohtsuki et al. | |
| 9,100,533 B2* | 8/2015 | Nakazawa | H04N 1/1013 |
| 9,179,083 B2* | 11/2015 | Nakazawa | H04N 1/1938 |
| 2001/0040704 A1 | 11/2001 | Kanno | |
| 2002/0036805 A1 | 3/2002 | Kanno et al. | |
| 2002/0048470 A1 | 4/2002 | Kanno | |
| 2002/0149505 A1 | 10/2002 | Kanno | |
| 2004/0047007 A1 | 3/2004 | Kanno | |
| 2004/0130757 A1* | 7/2004 | Mabuchi | H01L 27/14623 358/482 |
| 2007/0080419 A1 | 4/2007 | Shizukuishi | |
| 2007/0188638 A1 | 8/2007 | Nakazawa et al. | |
| 2008/0024842 A1 | 1/2008 | Tsukahara et al. | |
| 2008/0068467 A1 | 3/2008 | Kanno et al. | |
| 2008/0068683 A1 | 3/2008 | Kanno | |
| 2008/0106748 A1 | 5/2008 | Tsukahara et al. | |
| 2008/0212146 A1 | 9/2008 | Tsukahara et al. | |
| 2008/0252787 A1 | 10/2008 | Nakazawa et al. | |
| 2008/0297616 A1 | 12/2008 | Nagase et al. | |
| 2009/0002507 A1* | 1/2009 | Fukuhara | H01L 27/14609 348/222.1 |
| 2009/0059324 A1 | 3/2009 | Nagase et al. | |
| 2009/0213261 A1 | 8/2009 | Nagase et al. | |
| 2009/0256226 A1* | 10/2009 | Tatani | H01L 27/14831 257/432 |
| 2010/0027061 A1 | 2/2010 | Nakazawa | |
| 2010/0142009 A1 | 6/2010 | Tsukahara et al. | |
| 2010/0171998 A1 | 7/2010 | Nakazawa | |
| 2010/0225776 A1* | 9/2010 | Taura | H01L 27/14609 348/222.1 |
| 2010/0231979 A1 | 9/2010 | Nagase et al. | |
| 2011/0026083 A1 | 2/2011 | Nakazawa | |
| 2011/0051201 A1 | 3/2011 | Hashimoto et al. | |
| 2011/0063488 A1 | 3/2011 | Nakazawa | |
| 2011/0073923 A1* | 3/2011 | Tatani | H01L 27/14603 257/291 |
| 2012/0008173 A1* | 1/2012 | Konno | H04N 1/193 358/442 |
| 2012/0092732 A1 | 4/2012 | Nakazawa | |
| 2012/0199930 A1* | 8/2012 | Hayashi | H01L 27/1461 257/435 |
| 2012/0224205 A1 | 9/2012 | Nakazawa | |
| 2012/0235717 A1 | 9/2012 | Hirai et al. | |
| 2013/0063792 A1 | 3/2013 | Nakazawa | |
| 2013/0162870 A1 | 6/2013 | Miyoshi et al. | |
| 2013/0201373 A1 | 8/2013 | Izumi et al. | |
| 2014/0002151 A1 | 1/2014 | Watabe et al. | |
| 2014/0002170 A1 | 1/2014 | Miyanishi et al. | |
| 2014/0029065 A1 | 1/2014 | Nakazawa | |
| 2014/0204427 A1 | 7/2014 | Nakazawa | |
| 2014/0204432 A1 | 7/2014 | Hashimoto et al. | |
| 2014/0211273 A1 | 7/2014 | Konno et al. | |
| 2014/0368893 A1 | 12/2014 | Nakazawa et al. | |
| 2015/0098117 A1 | 4/2015 | Marumoto et al. | |
| 2015/0116794 A1 | 4/2015 | Nakazawa | |
| 2015/0155875 A1 | 6/2015 | Wada et al. | |
| 2015/0163378 A1 | 6/2015 | Konno et al. | |
| 2015/0222790 A1 | 8/2015 | Asaba et al. | |

FOREIGN PATENT DOCUMENTS

| | | |
|---|---|---|
| JP | 2007-243094 | 9/2007 |
| JP | 2015-041679 | 3/2015 |
| WO | 2009/148563 A1 | 12/2009 |

OTHER PUBLICATIONS

U.S. Appl. No. 14/750,143, filed Jun. 25, 2015.
Partial European Search Report mailed Feb. 9, 2016 in European Patent Application No. 15184062.6.

* cited by examiner

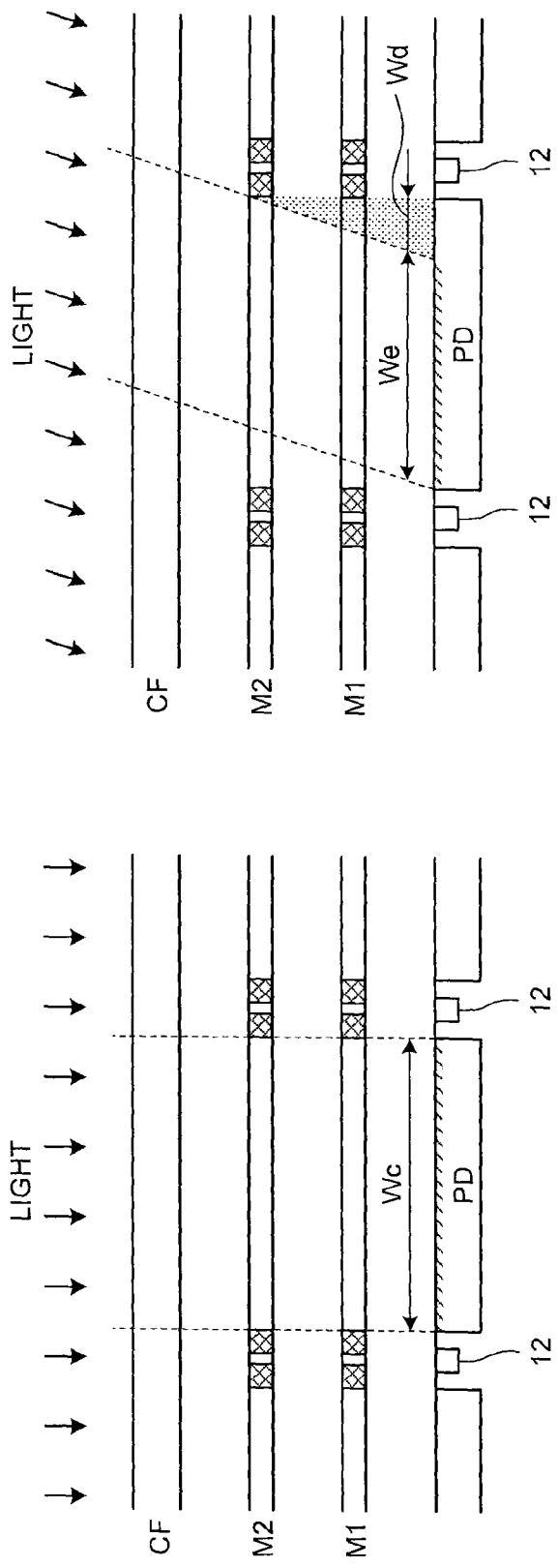

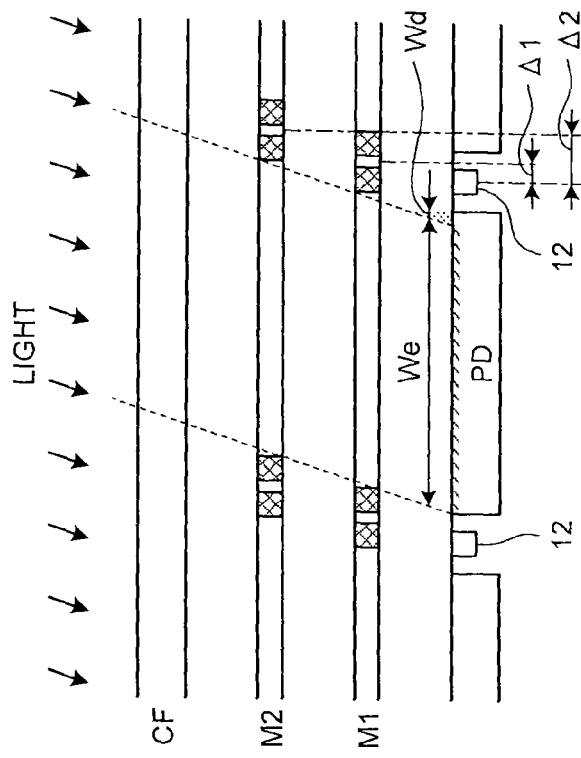
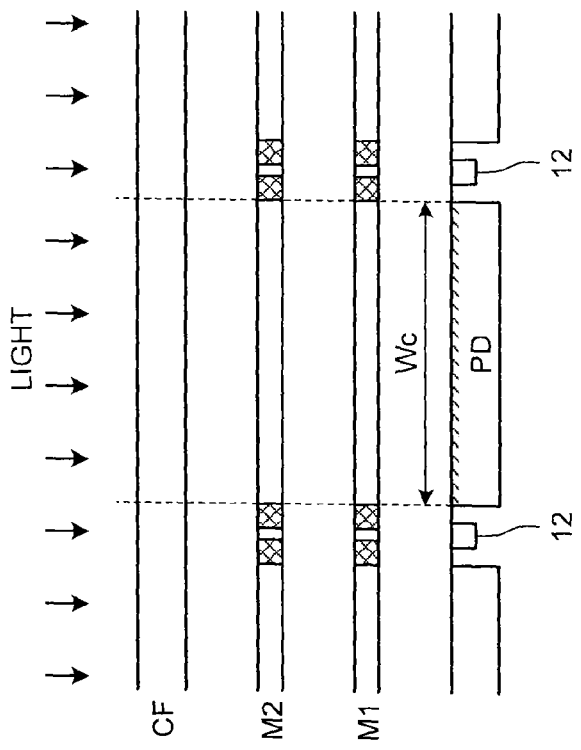

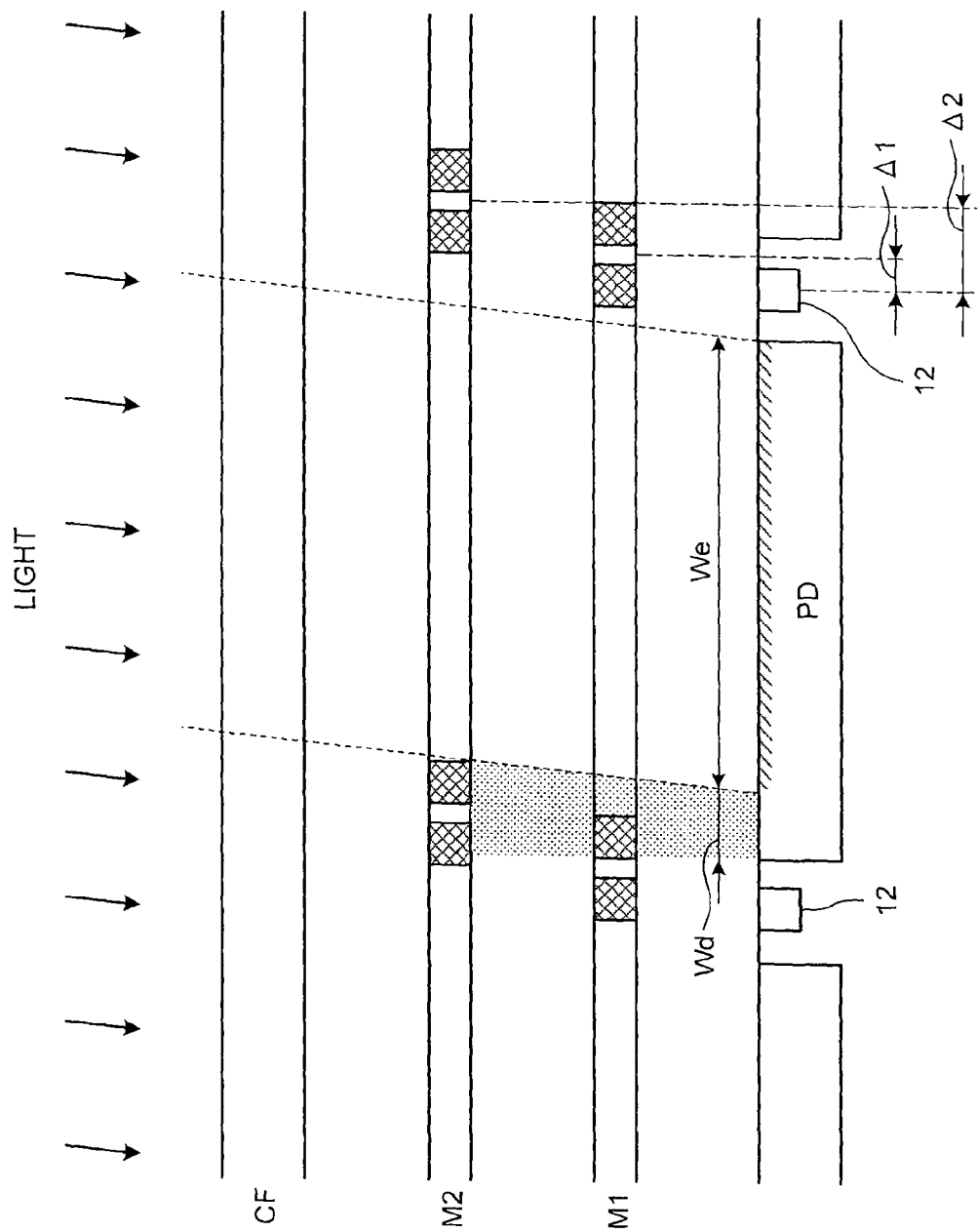

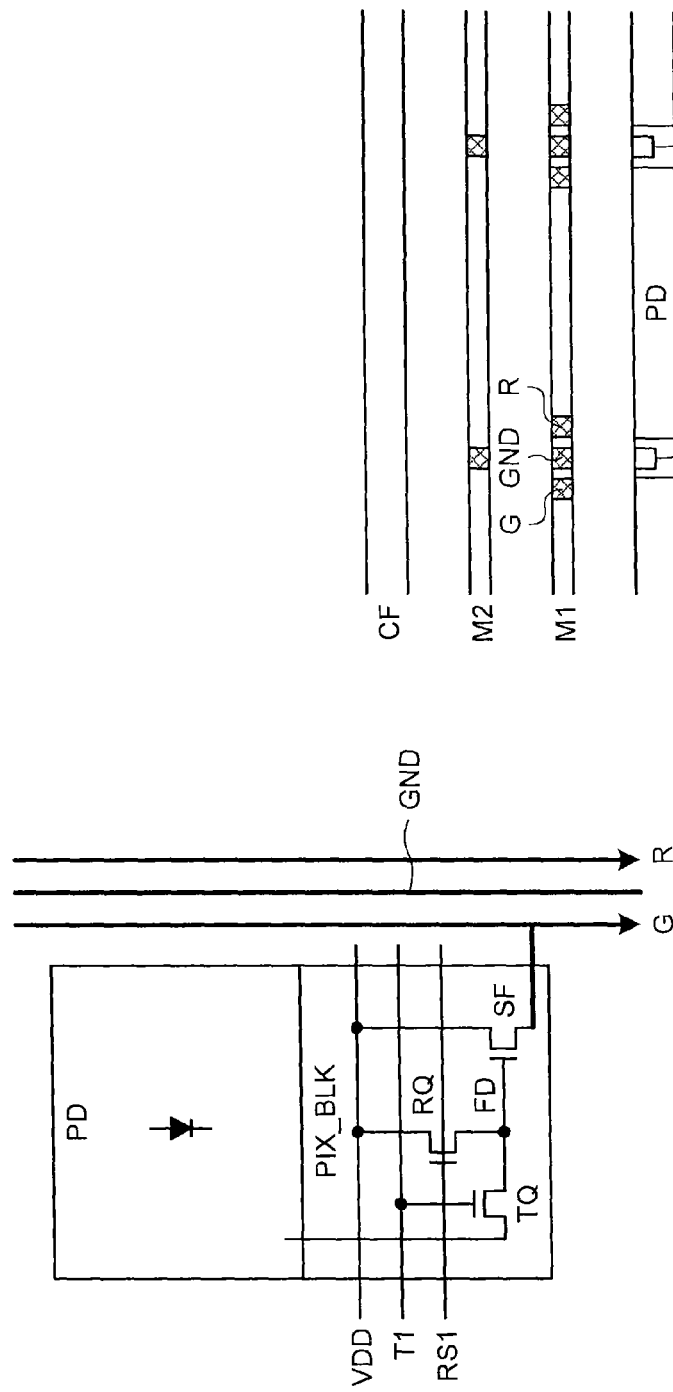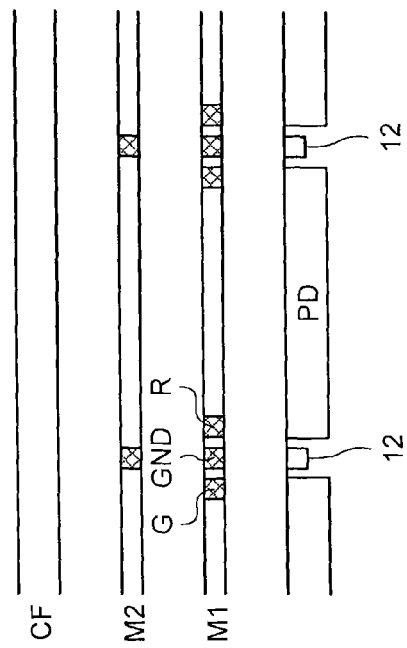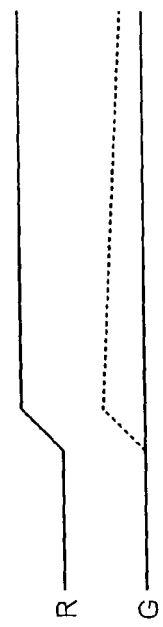

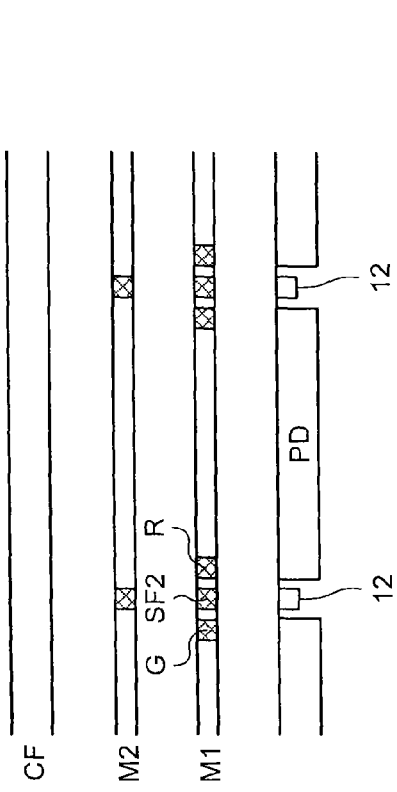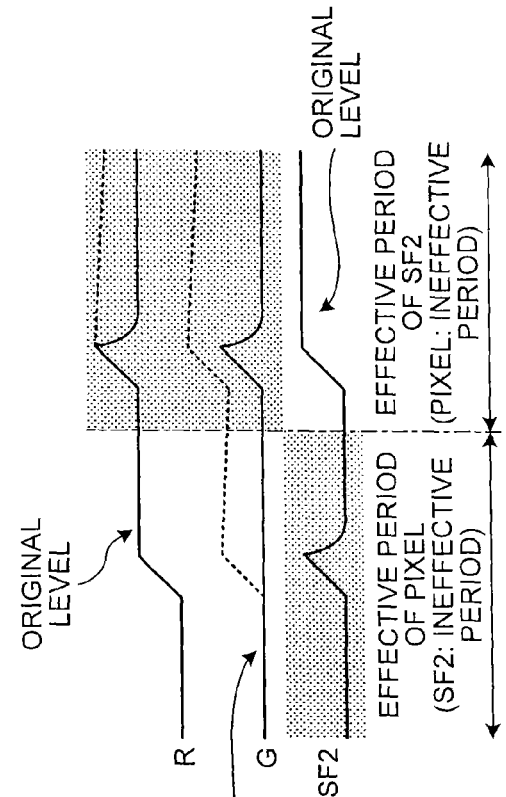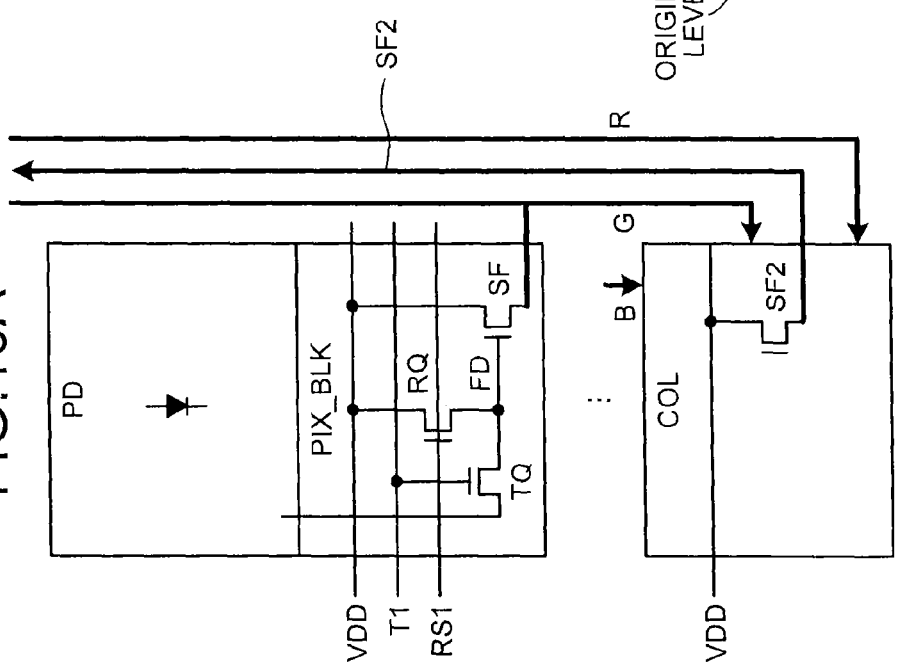

PHOTOELECTRIC CONVERSION ELEMENT, IMAGE READING DEVICE, AND IMAGE FORMING APPARATUS

CROSS-REFERENCE TO RELATED APPLICATIONS

The present application claims priority to and incorporates by reference the entire contents of Japanese Patent Application No. 2014-191963 filed in Japan on Sep. 19, 2014.

BACKGROUND OF THE INVENTION

1. Field of the Invention

The present invention relates to a photoelectric conversion element, an image reading device, and an image forming apparatus.

2. Description of the Related Art

For a photoelectric conversion element used in a scanner, a charge-coupled device (CCD) has conventionally been used. However, with recent demands for high speed processing, a complementary metal oxide semiconductor (CMOS) linear image sensor (CMOS sensor) has been attracting attention. The CMOS sensor is the same as CCDs in the point that photoelectric conversion of incident light is performed by a photodiode (PD). However, the CMOS sensor differs from CCDs in a point that charge-voltage conversion is performed near a pixel to be output to a subsequent stage. Moreover, because the CMOS process is used, the CMOS sensor can include therein a circuit such as an analog digital converter (ADC), and is more advantageous in high speed processing.

However, in a CMOS linear sensor, it is necessary to configure multiple circuits such as a transfer transistor that transfers a charge of a PD to a floating diffusion (FD), a reset transistor that resets an FD, and an amplifier transistor (source follower) that outputs a signal to a subsequent stage, for example, in a pixel.

Therefore, in a CMOS sensor, wirings such as a driving signal of respective circuits, and a power source and a ground (GND) are arranged in layers inside a pixel, and an opening (region through which light can enter) of a pixel is limited by these multilayer wirings. Particularly, because the opening of a pixel of a CMOS linear image sensor affects an incidence angle of light, it can cause unevenness in light amount (shading) in a scanner in which incidence angles of light is different at each pixel position, and there has been a problem that unevenness in an signal-to-noise (S/N) ratio in a main scanning direction is caused.

To tackle the above problem, for example, in Japanese Laid-open Patent Publication No. 2002-170944, a solid-state imaging device is disclosed in which positions of the opening and a micro lens are shifted toward a center of each imaging area from a corresponding photoelectric converting region.

However with a configuration in which an opening position is varied for each pixel, the opening position is fixed according to a light incidence angle, and accordingly, there has been a problem that an optical system used for incidence of light is limited.

In view of the above problem, there is a need to provide a photoelectric conversion element, an image reading device, and an image forming apparatus that can reduce unevenness in an amount of light received at each pixel without limiting an optical system that is used for incidence of light.

SUMMARY OF THE INVENTION

It is an object of the present invention to at least partially solve the problems in the conventional technology.

According to the present invention, there is provided a photoelectric conversion element comprising: a plurality of photodetectors that perform photoelectric conversion per pixel to output an analog image signal, and that are arranged on a straight line; and wirings that are formed on a wiring layer, and that are enabled to be used as at least one of a signal line used in a peripheral circuit of the photodetector, a power source, and a ground, wherein the photodetector is formed to have a first shaded region and a second shaded region in which light is shaded by the wirings that are positioned on the straight line sandwiching an opening, respectively, when light that has passed through the opening that opens being sandwiched by the wirings positioned on the straight line is incident perpendicularly on a light receiving surface of the photodetector.

The present invention also provides an image reading device comprising the above-described photoelectric conversion element.

The present invention also provides an image forming apparatus comprising: the above-described image reading device; and an image forming unit that forms an image read by the image reading device.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 3A and 3B are diagrams each illustrating schematic cross-section of a photoelectric conversion element in a first main scanning direction indicating reduction in sensitivity according to a light incidence angle;

FIGS. 5A and 5B are diagrams each illustrating schematic cross-section of a photoelectric conversion element in a main scanning direction indicating a configuration example of an opening that opens in a sandwiched manner between wirings in comparison;

FIG. 7 is a diagram illustrating a light reception range of the opening relative to a PD and of the PD in the configuration shown in FIG. 5B;

FIGS. 15A to 15C are diagrams illustrating read lines from a pixel, and a second configuration example that suppresses crosstalk in the read lines;

FIGS. 16A to 16C are diagrams illustrating read lines from a pixel, and a third configuration example that suppresses crosstalk in the read lines;

DETAILED DESCRIPTION OF THE PREFERRED EMBODIMENTS

Figure 1:
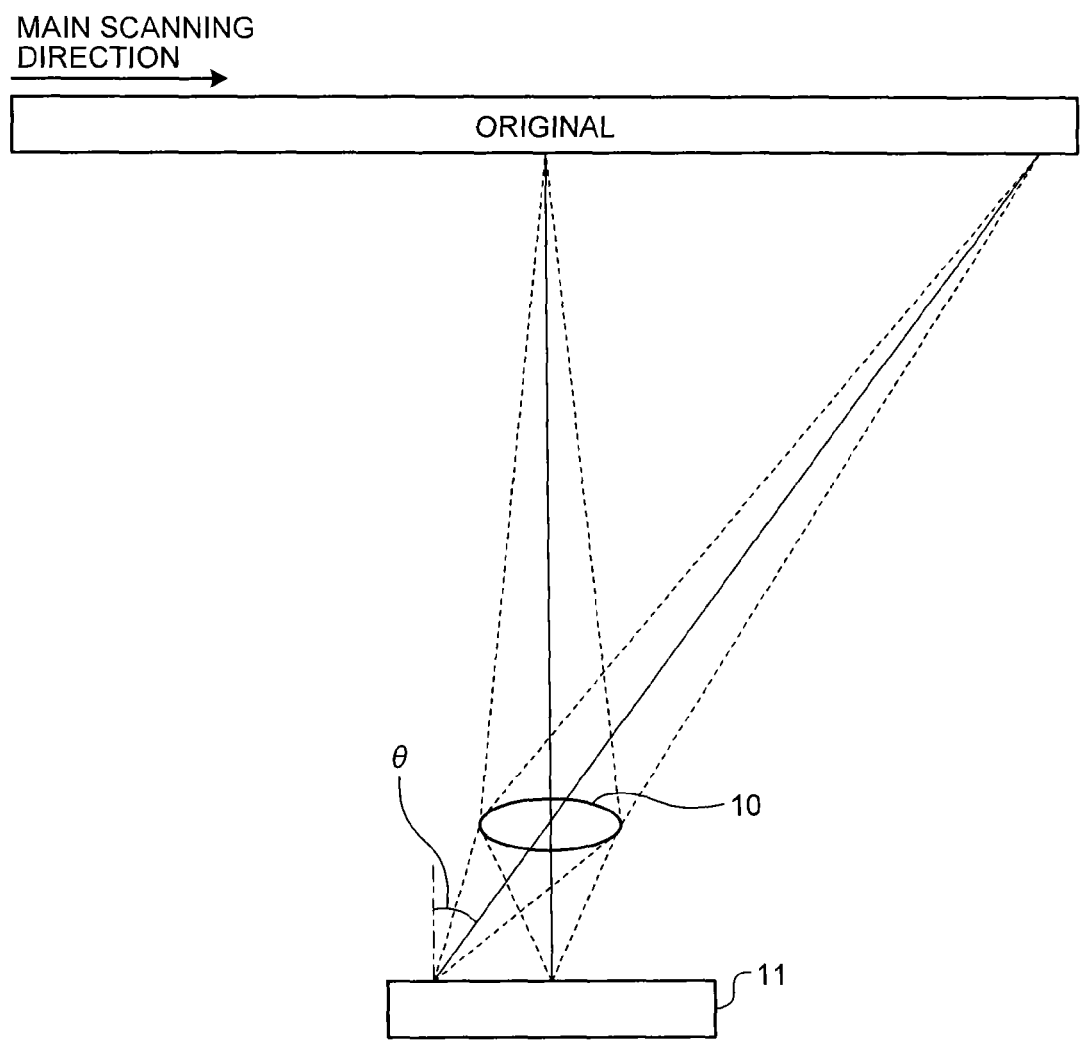
FIG. 1 is a diagram illustrating an overview of a reducing optical system of an image reading device.

First, background of achievement of the present invention is explained. FIG. 1 illustrates an overview of a reducing optical system of an image reading device. The reducing optical system of the image reading device forms an image with reflected light from an original in a reduced manner on a CMOS linear image sensor (photoelectric conversion element) 11 by a condenser lens 10.

The reducing optical system shown in FIG. 1 illustrates states in which reflected light from a central portion of an original in a main scanning direction and reflected light from an end portion of the original enter the photoelectric conversion element 11. A solid line indicates a main beam and a dotted line indicates right and left beams.

The reflected light (main beam) from the central portion of the original in the main scanning direction enters, through the lens 10, substantially perpendicularly to a light receiving surface of the photoelectric conversion element 11. The reflected light from the end portion of the original enters to the light receiving surface of the photoelectric conversion element 11 with a predetermined angle θ relative to the light receiving surface. As an angle of view that is determined by a focal length of the lens 10 and the like increases, the incidence angle θ increases. Moreover, the incidence angle θ is small near the central portion of an original in the main scanning direction, and increases as shifting away from the central portion.

When viewed from the photoelectric conversion element 11, the incidence angle θ of light is approximately 0 at a pixel to which reflected light from a vicinity of the central portion in the main scanning direction. The incidence angle θ gradually becomes large as shifting away from the center of the photoelectric conversion element 11, and becomes the largest at a pixel at the end portion of the photoelectric conversion element 11.

As described above, to the photoelectric conversion element 11 used in the reducing optical system, light with a predetermined angle enters. However, in the photoelectric conversion element 11, if the configuration of the reducing optical system is changed, the light incidence angle θ relative to the same pixel also changes. Although the lens 10 is used to collect reflected light from an original in the example in FIG. 1, it is not necessarily required to be a lens, and a curved mirror may be used.

Figure 2:
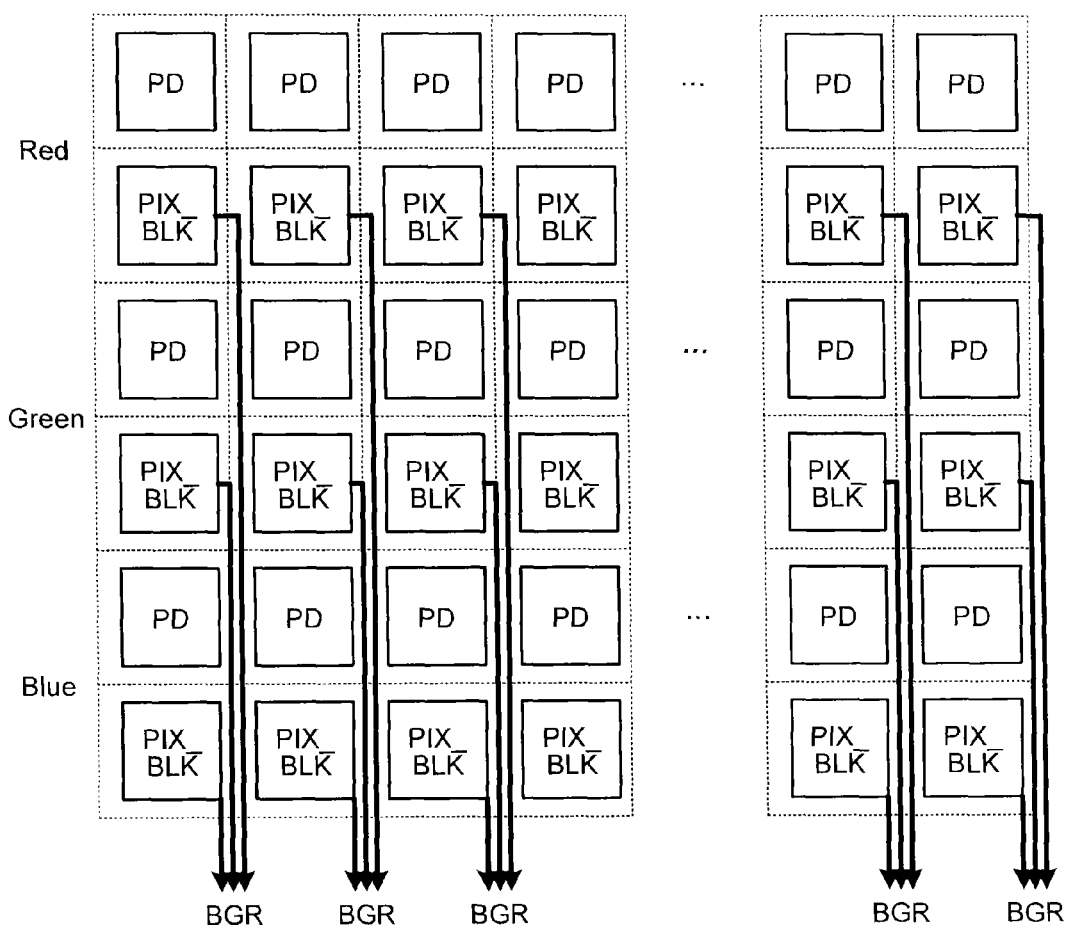
FIG. 2 is a diagram illustrating an exemplary overview of a pixel configuration of a photoelectric conversion element.

FIG. 2 is a diagram illustrating an exemplary overview of a pixel configuration of a CMOS linear image sensor (photoelectric conversion element). The CMOS linear image sensor that is used in an image reading device is the same as CCDs in the point that photoelectric conversion of incident light is performed by a photodiode (PD). However, the CMOS sensor differs from CCDs in the point that charge-voltage conversion is performed near a pixel to be output to a subsequent stage.

A pixel of the CMOS linear image sensor includes a photodetector (photo diode: PD) that photoelectric converts light, a pixel circuit (PIX_BLK) that converts an electric charge (analog image signal) accumulated in the PD into a voltage signal. Although PIX_BLK includes a floating diffusion (FD) that performs charge-voltage conversion, a reset transistor that resets the FD, and a transfer transistor that transfers an electric charge of the PD to the FD, these are not shown in FIG. 2.

Furthermore, respective pixels are aligned in one direction per color of RGB, and an image signal that has been converted in to a voltage by PIX_BLK is output to a subsequent stage through read lines (RGB). In the subsequent stage of the read lines, a programmable gain amplifier (PGA), an analog digital converter (ADC), and the like are connected.

The CMOS linear image sensor is different from CCDs in a point that a pixel circuit is provided for each pixel. Because of this, in the CMOS linear image sensor, many wirings, such as a read line to read an image signal from PIX_BLK, a control signal (a reset signal, a transfer signal) of PIX_BLK, a power source and a GND, are arranged around a pixel.

Particularly, when lots of wirings are arranged around the PD, to save a wiring region, it is necessary to reduce an area for the PD. Therefore, the sensitivity is degraded. Accordingly, in CMOS linear image sensors, it is common to arrange wirings with multiple wiring layers by setting wiring layers in a multilayer structure.

FIGS. 3A and 3B are diagrams each illustrating schematic cross-section of a photoelectric conversion element (CMOS linear image sensor) in a first main scanning direction indicating reduction in the sensitivity according to a light incidence angle. As shown in FIGS. 3A and 3B, the photoelectric conversion element has a PD for each pixel, and a pixel separation region (shallow-trench-isolation (STI)) 12 to separate respective pixels is formed. Moreover, in the photoelectric conversion element, wirings that are used for the read lines to read signals from the pixels, the power source, the GND, and the like are structured, for example, over two wiring layers (M1, M2), and a color filter (CF) is arranged on the wiring layers. Between respective layers, an insulator film layer is arranged.

Furthermore, the wirings are formed above the STI, for example. In the photoelectric conversion element, light passes through a region (an opening to open the PD) in which the wirings are not present. That is, an opening width (width through which light can be irradiated to the light receiving surface) of a pixel is determined by a width of a region in which a region without presence of the wirings and a region with presence of the PD overlap with each other with respect to a light incident direction. In the example shown in FIG. 3, the width in which the wirings are not present and the width of the PD are the same.

As shown in FIG. 1, light that enters the pixel in the central portion of the photoelectric conversion element enters substantially perpendicularly to a light receiving surface of the PD, and an opening width (Wc) corresponds to an entire region of the PD (FIG. 3A). On the other hand, light that enters to a pixel at an end portion of the photoelectric conversion element is to be input with a predetermined angle, and therefore, an opening width (WE) decreases by Wd relative to the opening width (Wc) at the central portion (Wc>We: FIG. 3B).

When angled light is input to the light receiving surface of the PD, as shown in FIG. 3B, incident light is rejected by the wiring on the M2. That is, the wiring forms a shade on the PD. Because an influence of this wiring is more likely to be generated as the number of wirings (wiring layers) increases, a CMOS linear image sensor is particularly disadvantageous.

As shown in FIGS. 3A and 3B, when the width of the PD and the width of the region in which the wirings arranged above the PD are not present are the same, a problem of shading (unevenness in a light reception amount) in which the sensitivity is reduced in a pixel as it is shifted to the end portion compared to the pixel in the central portion of the photoelectric conversion element occurs. This shading causes unevenness in an S/N ratio, resulting in deterioration in the image quality. Particularly, this problem is significant in CMOS linear image sensors in which lots of wirings are arranged between pixels.

In CCDs, because there is no (or a few) wirings between pixels generally, there scarcely is the influence of reduction in the sensitivity depending on a light incidence angle described above. Moreover, in a one-to-one optical system such as a contact image sensor (CIS), light with an angle is not input from an original in the first place, and therefore, such a problem does not occur. That is, the shading described above is a problem having a significant influence particularly in CMOS linear image sensors of the reducing optical system. Specifically, it is because, as shown in FIG. 2, while a signal output from a PD is output from a read wiring that is arranged per pixel from PIX_BLK in CMOS linear sensors, a single read line is arranged in a single line in area sensors generally. That is, because the number of wirings arranged between PDs is larger in a CMOS linear sensor than that in an area sensor, the influence is significant therein.

Figure 4A:
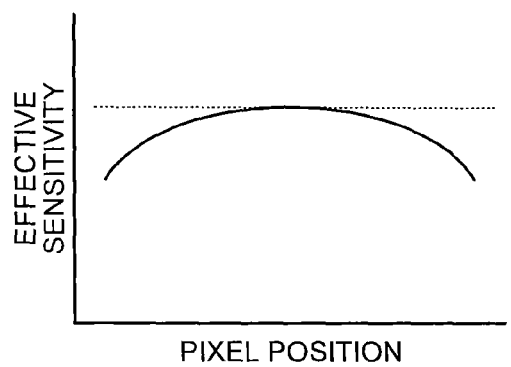
FIG. 4A is a graph showing an effective sensitivity of light that varies according to a position of a pixel arranged in the main scanning direction.
Figure 4B:
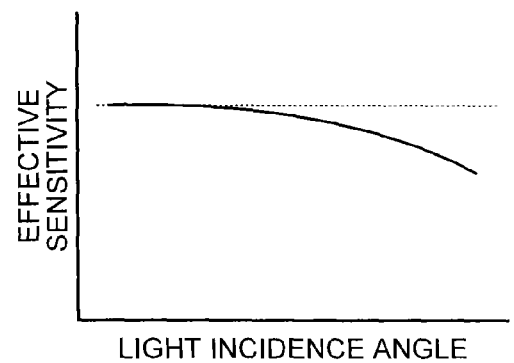
FIG. 4B is a graph showing an effective sensitivity of light that varies according to an incidence angle of light for a pixel.

FIGS. 4A and 4B are graphs showing an effective sensitivity of light that varies according to a position of a pixel arranged in the main scanning direction and an incidence angle of light for the pixel. FIG. 4A indicates an influence of a wiring to shading at each position of a pixel arranged in the main scanning direction. As shown in FIG. 3, in the CMOS linear image sensor in the reducing optical system, according to an incidence angle of light to a pixel, the light is rejected by a wiring. Therefore, the sensitivity is reduced in a pixel as it is positioned further away from the pixel in the central portion in the main scanning direction (FIG. 4A). Moreover, focusing on an arbitrary pixel at an end in the main scanning direction, the reduction in the sensitivity becomes more serious depending on a light incidence angle (FIG. 4B).

FIGS. 4A and 4B illustrate a distribution of the effective sensitivity viewed from each pixel, and when light is not rejected by a wiring, it shows a flat ideal property as indicated by a dotted line. Although there is attenuation in an amount of incident light by cosine fourth-power law and the like in an actual state, for simplicity of explanation, an attenuation other than that of rejected light is excluded in FIGS. 4A and 4B.

FIGS. 5A and 5B are diagrams each illustrating schematic cross-section of a photoelectric conversion element (CMOS linear image sensor) in the main scanning direction indicating a configuration example of an opening that opens in a sandwiched manner between wirings in comparison. FIG. 5A is the same as FIG. 3A. FIG. 5B indicates a state of an incident light to a pixel at an end portion of the photoelectric conversion element similarly to FIG. 3B, but differs from FIG. 3B in a point that positions of wirings on M1 and M2 layers are shifted by Δ1 and Δ2, respectively, relative to positions of the PD and the STI.

While rejection of incident light occurs in FIG. 3B, in a configuration shown in FIG. 5B, a position of an opening is shifted for each pixel so that light is not rejected by a wiring, and thereby suppressing shading. Although a pixel at an end portion the photoelectric conversion element is depicted in the example shown in FIG. 5B, the same is applied to pixels other than that at the end portion, and it is arranged such that a shift amount of a wiring (Δ1 and Δ2) in the main scanning direction gradually varies per pixel according to a pixel position.

Figure 6:
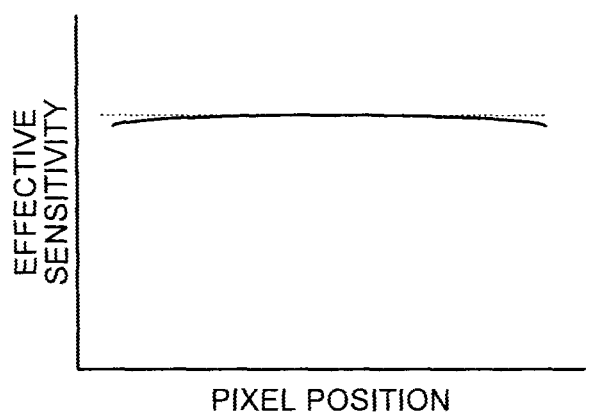
FIG. 6 is a graph showing an effective sensitivity of light relative to a position of a pixel in the main scanning direction in a configuration depicted in FIG. 5B.

FIG. 6 is a graph showing an effective sensitivity of light relative to a position of a pixel in the main scanning direction in the configuration shown in FIG. 5B. Because the positions of wirings are shifted for each pixel so that rejection of light is minimized in the configuration shown in FIG. 5B, an influence of shading is suppressed.

FIG. 7 is a diagram illustrating a light reception range of the opening relative to a PD and of the PD in the configuration shown in FIG. 5B. In the configuration shown in FIG. 5B, by setting a position of a wiring (that is, an opening) for each pixel to be optimal to correspond to a light incidence angle in advance, shading is suppressed. As shown in FIG. 7, for example, when an angle of view is narrower than the condenser lens used in FIG. 5B, that is, a light incidence angle is small, rejection by a wiring occurs to worsen the shading.

As described, in the configuration shown in FIG. 5B, even though the wirings are arranged at the positions optimized for a light incidence angle predetermined for each pixel, the optimal condition is not satisfied when light is irradiated at a different incidence angle, and rejection of light occurs. Therefore, in the technique of suppressing shading by shifting an opening position per pixel, an angle of view, that is, an applicable condenser lens is limited according to a CMOS linear image sensor, and versatility is degraded.

Furthermore, if an image sensor in which micro lenses (on-chip lenses) are combined is the configuration shown in FIG. 5B, an influence of rejection of light increases when a light incidence angle is changed. That is, when light condensed by a micro lens is rejected by a wiring, substantially entire light to be input a pixel is to be rejected. Therefore, the influence is to be beyond the correctable extent of shading correction, resulting in forming a pixel called a pixel omission, from which an image cannot be read.

Figure 8A:
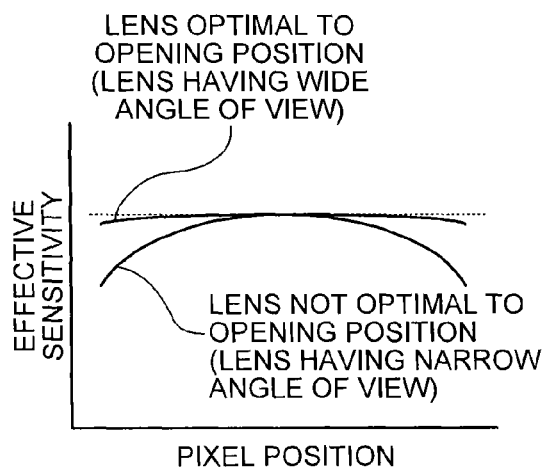
FIG. 8A is a graph showing an effective sensitivity of light that varies according to a pixel position of a pixel for each type of lens.
Figure 8B:
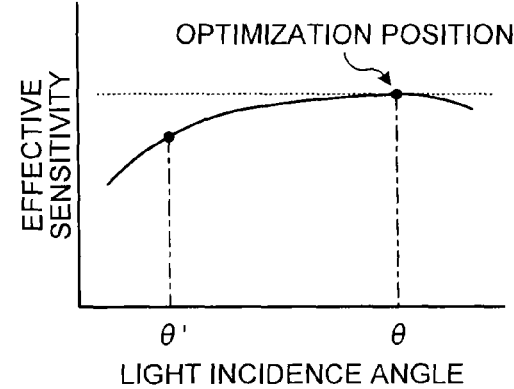
FIG. 8B is a graph showing an effective sensitivity of light that varies according to an incidence angle of light relative to a position of a pixel arranged in the main scanning direction.

FIGS. 8A and 8B are graphs showing an effective sensitivity of light that varies according to an incidence angle of light relative to a position of a pixel arranged in the main scanning direction, and to the pixel for each type of lens. While when a condenser lens having an optimal angle of view is used in the configuration shown in FIG. 5B at an opening position varied per pixel, an influence of shading is reduced, when a condenser lens having a not optimal narrow angle of view (the light incidence angle is small) is used in the configuration shown in FIG. 5B, shading is to be worsened even though the incidence angle is originally small and the an influence of shading is supposed to be small (FIG. 8A).

That is, as is obvious from the property of sensitivity for a light incidence angle at an arbitrary pixel at an end shown in FIG. 8B, when a shift amount of a wiring is determined to be optimized based on an arbitrary incidence angle (θ) per pixel, although reduction in the sensitivity is suppressed at the incidence angle θ, shading is not even reduced but worsened because the optimal condition is not satisfied at other incidence angles (θ'). That is, a condenser lens other than the condenser lens having the incidence angle θ cannot be used. As described, in a photoelectric conversion element in which a shift amount of a wiring is varied per pixel, when light enters at an incident light that is not optimized, shading is worsened, and therefore, a range of applicable lenses is limited.

An area image sensor is mainly used as a camera, and a distance between an area image sensor and a condenser lens (conjugate length) is generally several centimeters (cm) and is in a narrow range. Therefore, any condenser lens makes a small difference in an angle of view that is determined by the conjugate length, and an influence to shading is small. However, a linear image sensor is mainly used as a scanner, and is required to support various kinds of optical modes; therefore, the conjugate length is ten to several tens of cm and in a wide range. Therefore, differences in an angle of view of condenser lenses are large, and worsening of shading depending on a condenser lens as described above can be regarded as a problem specific to linear image sensors.

Figure 9A:
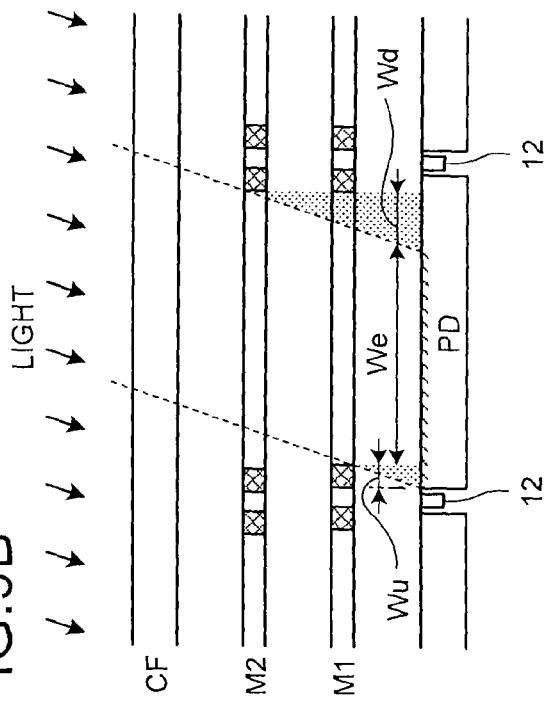
FIGS. 9A, 9B, and 9C are diagrams each illustrating a schematic cross-section of a photoelectric conversion element in the main scanning direction according to an embodiment of the present invention.
Figure 9B:
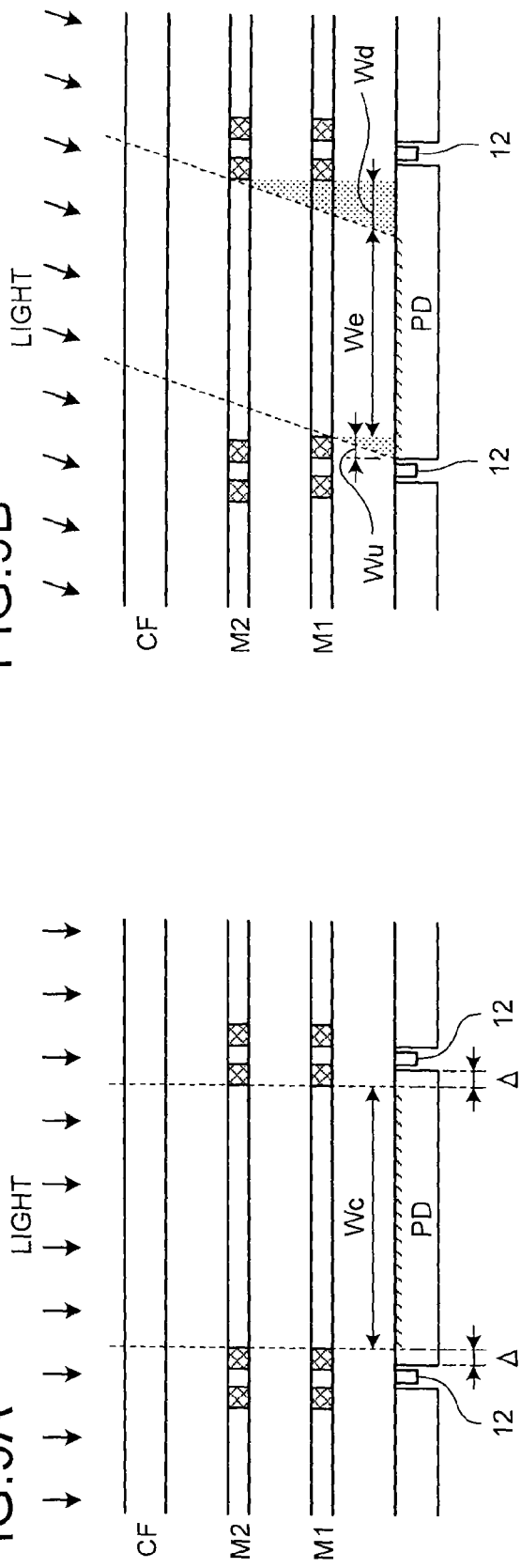
Figure 9C:
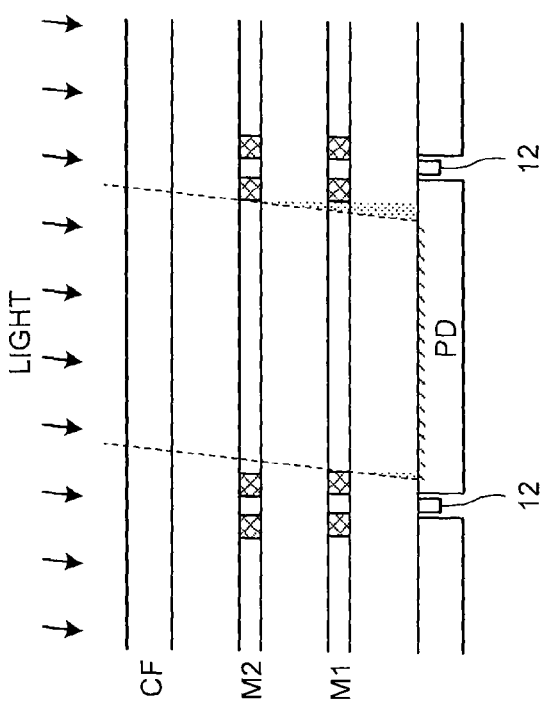

FIGS. 9A to 9C are diagrams each illustrating a schematic cross-section of a photoelectric conversion element (CMOS linear image sensor) according to an embodiment in the main scanning direction. In the configuration shown in FIG. 3A described above, an optical path is not in contact with the wiring on side on which light is not rejected. This is caused because it is formed such that an end of the wiring and an end of the PD are aligned, and conversely, this means that light that is not received by the PD and is not rejected by the wiring is still present. The photoelectric conversion element according to the embodiment shown in FIGS. 9A to 9C is configured such that a region of a PD is present under a wiring when the photoelectric conversion element is viewed from above. Furthermore, PDs are aligned, for example, on a straight line in a main scanning direction for each color.

FIG. 9A illustrates a state of incidence of light to a pixel in a central portion of the photoelectric conversion element in the main scanning direction. The configuration shown in FIG. 9A differs from the configuration shown in FIG. 3A in points that is formed such that a region of a PD is wider toward both outsides on a straight line extending in the main scanning direction by A, and that the PD is present under wirings on the M1 layer forming an opening. Because the opening in the M1 layer and an opening in the M2 layer are the same, the final opening width of a pixel in a central portion in the configuration shown in FIG. 9A is Wc and is the same as that in FIG. 3A. Hereinafter, two light shaded regions that are formed on both sides of the PD, and the width of which is Δ shown in FIG. 9A may be described respectively as a first shaded region and a second shaded region.

FIG. 9B illustrates a state of incidence of light to a pixel at an end portion of the photoelectric conversion element in the main scanning direction. In a configuration shown in FIG. 9B is the same as the configuration shown in FIG. 3B in a point that first, rejection of light by a wiring occurs in the M2 layer, and a practical opening width is decreased by Wd. However, unlike the configuration shown in FIG. 3B, in the configuration shown in FIG. 9B, because the PD region is formed under the wirings, light that enters under the wirings by being angled at the incidence of light is irradiated to the PD on a side on which rejection of light does not occur. That is, while the opening width (Wd) that decreases due to rejection of light is present, an opening width (Wu) that increases because light that has not been irradiated to the PD in the configuration shown in FIG. 3B is irradiated to the PD is also present. That is, a final opening width (We) is expressed by Equation 1 below.

$$We = Wc - Wd + Wu \qquad (1)$$

We: an opening width at a pixel at an end portion
Wc: an opening width at a pixel at a central portion
Wd: an opening width of a pixel at an end portion that decreases by being rejected by a wiring
Wu: an opening width of a pixel at an end portion that increases due to an increased PD width As described, in the configuration shown in FIG. 9B, the reduction of light by rejection is supplemented by the increase obtained by widening the PD, and an amount of light to be received increases by Wu from the opening width (Wc−Wd) in the configuration shown in FIG. 3B.

Moreover, in FIG. 9C, a case of a light incidence angle smaller than that of FIG. 9B is shown. The opening width in this case is similarly determined by above Equation 1, and reduction of light by rejection is supplemented by increase obtained by widening a PD.

In the configuration shown in FIG. 9B, a light rejection amount and an increase amount obtained by widening the PD vary according to an incident light angle, and there is a monotonous tendency that the opening width increases as the incidence angle decreases. This is because it is not the configuration having a fixed opening direction per pixel as in the configuration shown in FIG. 5B. That is, specific worsening of shading depending on a light incident light as shown in FIG. 7 does not occur, and therefore, condenser lenses (angle of view) to be used in the image reading device are less limited.

Figure 10A:
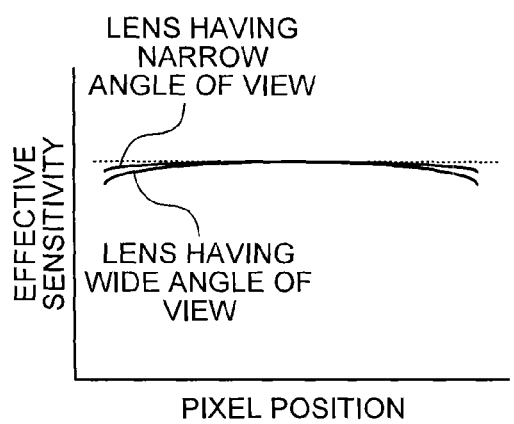
FIG. 10A is graph showing an effective sensitivity of light that varies according to a pixel position of a pixel for each type of lens.
Figure 10B:
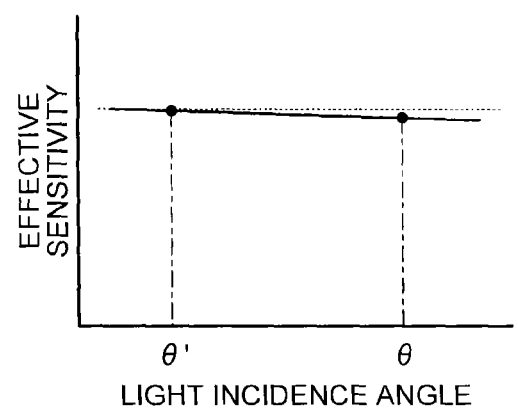
FIG. 10B is a graph showing an effective sensitivity of light that varies according to an incidence angle of light relative to a position of a pixel arranged in the main scanning direction.

FIGS. 10A and 10B are graphs showing an effective sensitivity of light that varies according to an incidence angle of light relative to a position of a pixel arranged in the main scanning direction, and to the pixel for each type of lens. In the configuration shown in FIGS. 9A and 9B, an influence of shading is reduced irrespective of an angle of view (light incidence angle) of a condenser lens (FIG. 10A). This is because it is not configured that the photoelectric conversion element has a fixed opening direction as the configuration shown in FIG. 5B, and therefore, when deterioration in the sensitivity at certain incidence angle (θ) at an arbitrary pixel at an end portion is suppressed, reduction of the sensitivity is further suppressed at an incidence angle (θ') that is smaller than the incidence angle (θ) (FIG. 10B). Therefore, in the configuration of the photoelectric conversion element shown in FIGS. 9A to 9C, the state that a range of applicable lenses is limited as shown in FIGS. 8A and 8B has been changed for the better.

As described, by forming the photoelectric conversion element so as to have two regions (the first shaded region and the second shaded region) in which light is shaded by respective wirings positioned on a straight line sandwiching the opening when light that has passed through the opening that opens being sandwiched by the wirings positioned on the straight line perpendicularly enters to a light receiving surface of the PD, light rejected by the wiring with respect to the photodetector can be supplemented, and shading caused by a difference of a condenser lens (angle of view) can be suppressed. Moreover, in the configuration shown in FIG. 9B, it is possible to configured the same in all of the pixels, and therefore, the development cost can be reduced compared to the configuration shown in FIGS. 5A and 5B.

Figure 11A:
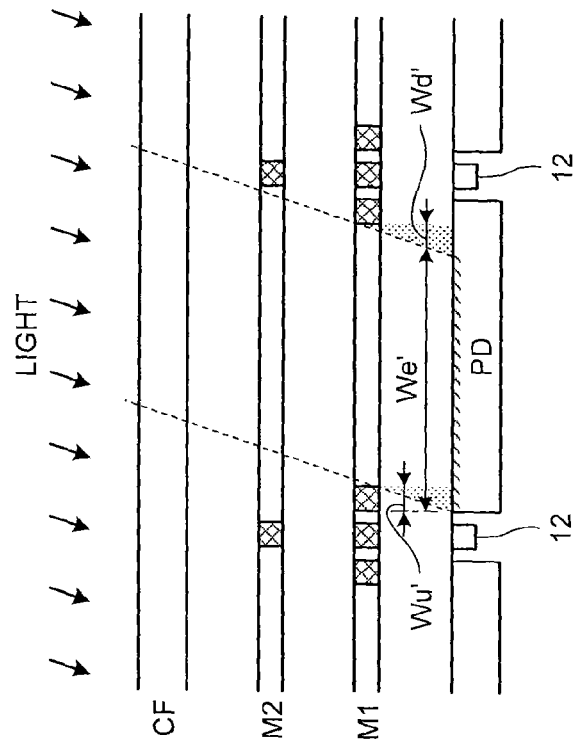
FIGS. 11A and 11B are diagrams each illustrating a schematic cross-section of a modification of the photoelectric conversion element according to the embodiment in the main scanning direction.
Figure 11B:
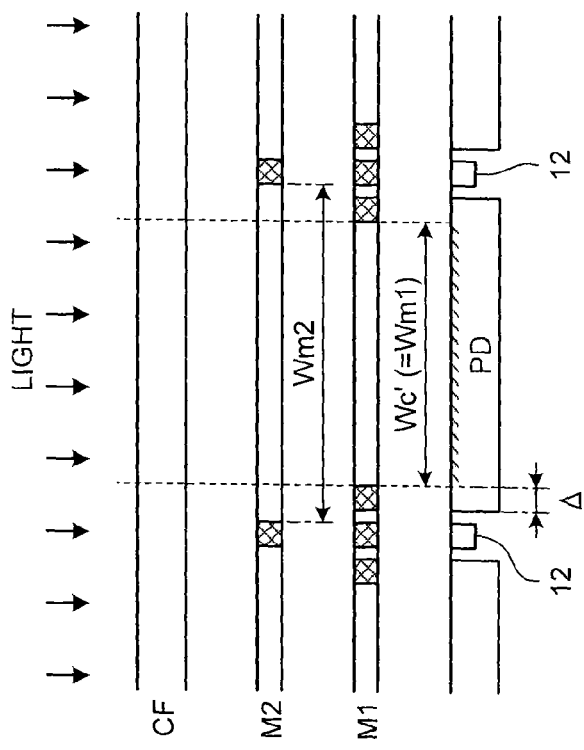

FIGS. 11A and 11B are diagrams each illustrating schematic cross-section of a modification of the photoelectric conversion element (CMOS linear image sensor) according to the embodiment in the main scanning direction. Although the effect of reducing shading irrespective of a light incidence angle in the configuration shown in FIGS. 9A to 9C, the shading itself occurs, and the improvement cannot necessarily be considered sufficient. Moreover, as shown in FIG. 9B, a wiring at higher level (positioned far from the PD) contributes more to rejection of light causing shading. For example, in the case shown in FIG. 9B, although the positions of the wirings on the M1 layer and the M2 layer are the same, light is rejected by the wiring on the M2 layer far from the PD and the wiring on the M1 layer does not contributes to the rejection at all. This means that a wiring at a higher level that is far from the PD has a larger influence to rejection, and to reduce rejection on this layer at a high level is important to reduce shading.

Therefore, the modification of the photoelectric conversion element according to the embodiment has a configuration in which wirings are arranged such that an opening (region through which light can be passed) is larger on a wiring layer farther from the PD, thereby further reducing shading. Specifically, in the modification of the photoelectric conversion element shown in FIGS. 11A and 11B, three wirings are arranged on the M1 and one wiring is arranged on the M2 while two wirings are arranged on each of the M1 layer and the M2 layer in the photoelectric conversion element shown in FIGS. 9A to 9C.

In the photoelectric conversion element shown in FIGS. 11A and 11B, an opening width (Wm2) of the M2 is larger than an opening width (Wm1) of the M1. In FIG. 11A, similarly to the case shown in FIG. 9A, a state of incidence of light to a pixel at a central portion of the photoelectric conversion element is shown, and a light reception amount does not change when light is perpendicularly input to the light receiving surface of the PD.

On the other hand, in incidence of light to a pixel at an end portion of the photoelectric conversion element shown in FIG. 11B, rejection of light is reduced compared to the case shown in FIG. 9B. This is because rejection of light by the wiring on the M2 layer is eliminated as a result of widening an opening on the M2 layer, and it is regarded that an effect equivalent to shifting a position of a wiring shown in FIG. 5B is produced. However, because the photoelectric conversion element shown in FIGS. 11A and 11B has a configuration in which the opening direction is not fixed according to a light incident direction and the opening direction is widened, rejection of light is not worsen even when a light incidence angle is small as shown in FIG. 7.

Moreover, in the configuration shown in FIGS. 11A and 11B, rejection of light by the wiring on the M2 layer is eliminated, and light is to be rejected by a wiring on the M1 layer. In this case, when incident light is angled, an opening width (We') is expressed by Equation 2 below.

$$We' = Wc' - Wd' + Wu' \quad (2)$$

We': an opening width at a pixel at an end portion
Wc': an opening width at a pixel at a central portion
Wd': an opening width of a pixel at an end portion that decreases by rejection by a wiring
Wu': an opening width of a pixel at an end portion that increases by a widened PD Furthermore, because the thickness of the wiring (height direction in the drawing) is smaller than the width, Wd'≈Wu', and Equation 3 below is established.

$$We' \approx Wc' \quad (3)$$

Specifically, in the configuration of the photoelectric conversion element shown in FIGS. 11A and 11B, a decreased amount and an increased amount of received light cancel each other out, and the sensitivity of a pixel at a central portion and the sensitivity of a pixel at an end portion become substantially equal to each other. As described, in the photoelectric conversion element according to the embodiment, by having a larger opening for wirings farther from the PD, rejection of light by the wiring is canceled, and shading can be suppressed.

Although in the configuration shown in FIGS. 11A and 11B, an example in which the number of wirings between pixels is four is indicated, even if the number is not necessarily four, a similar effect can be obtained. Moreover, although in the configuration shown in FIGS. 11A and 11B, an opening width is varied by changing the number of wirings to be arranged on each wiring layer, the photoelectric conversion element may be configured so that a similar effect can be obtained by changing a width of a wiring and the like, even if the number of wirings on the respective wiring layers is the same, for example. Furthermore, although in FIGS. 11A and 11B, an example of pixels that are arranged in the main scanning direction is shown, the photoelectric conversion element may be configured similarly for pixels arranged in a sub-scanning direction to obtain a similar effect.

In the configuration shown in FIGS. 11A and 11B, the opening of the M2 is larger, while the opening of the M1 is small. Therefore, the sensitivity of a pixel at a central portion is reduced; however, generally, in a CMOS linear image sensor, a width of a wiring relative to a width of a PD is about 1/20, and an influence of reduction in the sensitivity in the pixel at the central portion is small and can be ignored.

Figure 12A:
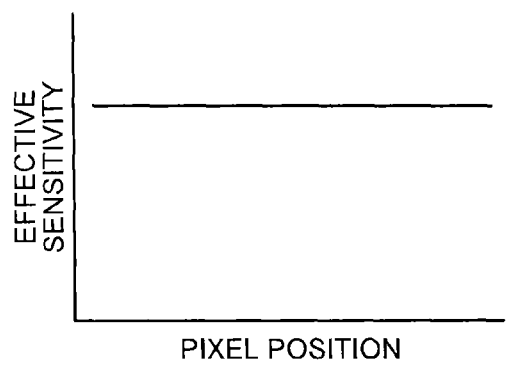
FIG. 12A is a graph showing an effective sensitivity of light corresponding to a position of a pixel arranged in the main scanning direction.
Figure 12B:
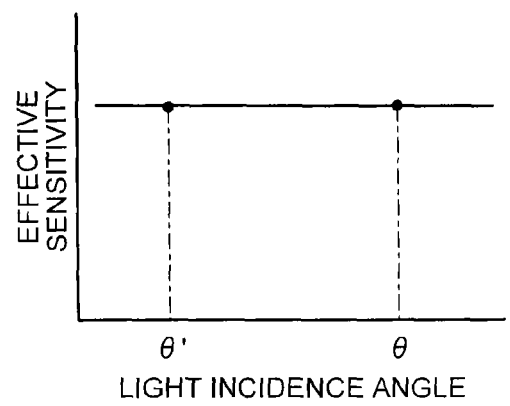
FIG. 12B is a graph showing an effective sensitivity of light corresponding to an incidence angle of light relative to the pixel.

FIGS. 12A and 12B are graphs showing an effective sensitivity of light corresponding to an incidence angle of light relative to a position of a pixel arranged in the main scanning direction, and to the pixel in the configuration of the photoelectric conversion element shown in FIGS. 11A and 11B. As shown in FIGS. 12A and 12B, in the configuration of the photoelectric conversion element shown in FIG. 11, reduction of sensitivity is canceled irrespective of a light incidence angle, and therefore, shading does not occur.

Next, a configuration of a photoelectric conversion element that prevents occurrence of a difference in shading per color of received light is explained. The wirings shown in FIGS. 9A to 9C includes a read line from PIX_BLK shown in FIG. 2. Focusing on a read line that is arranged between PD-PD of respective colors shown in FIG. 2, no read line is present in Red, a read line is arranged in Green, and read lines of Red/Green are arranged in Blue. That is, read lines arranged between pixels differ for each color. This is caused because a signal is read (an example of reading out to a subsequent stage on a lower side in FIG. 2) in an arbitrary one direction. The difference in wirings that are arranged around the PDs causes a difference in shading per color.

Figure 13:
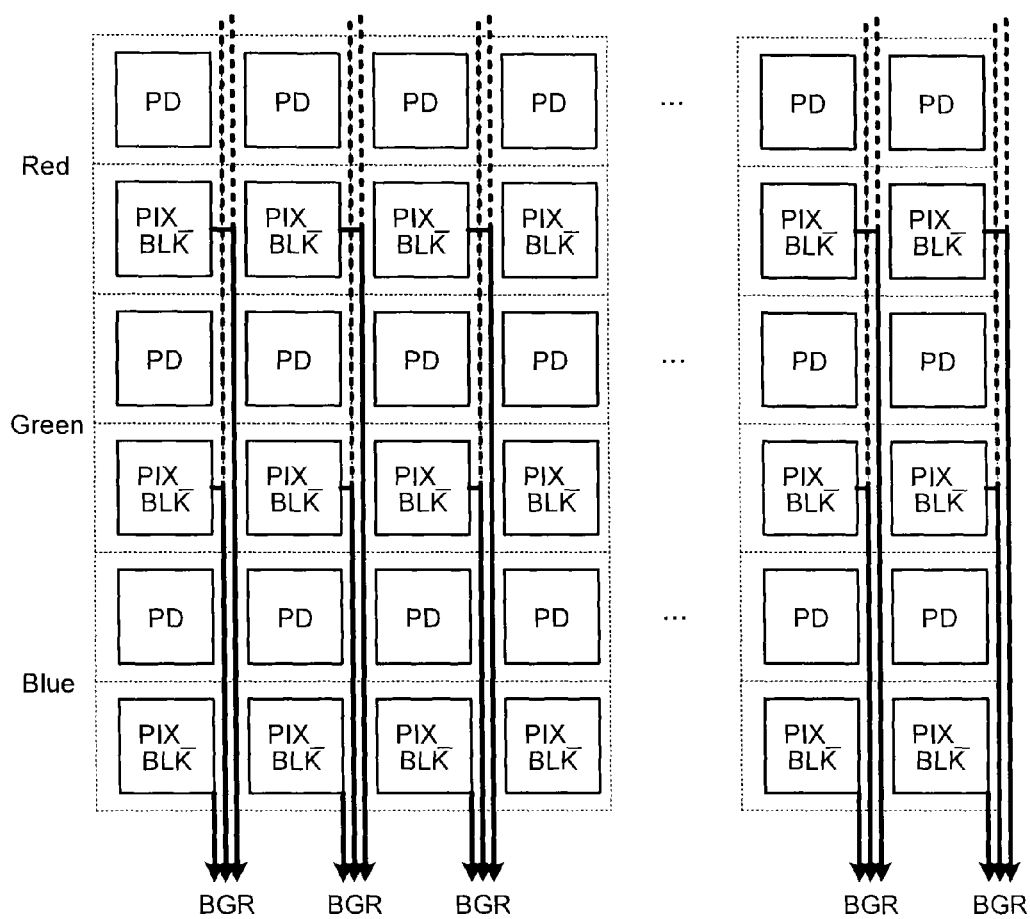
FIG. 13 is a diagram illustrating an overview of a configuration of a photoelectric conversion element that prevents a difference in shading for each color of receiving light.

FIG. 13 is a diagram illustrating an overview of a configuration of a photoelectric conversion element that prevents a difference in shading for each color of receiving light. As shown in FIG. 13, in the photoelectric conversion element, by forming a dummy read line that is indicated by a broken line between pixels of Red and the like, read lines arranged between PD-PD per color are made identical.

For example, in the configuration shown in FIG. 13, because a read line of Red reads a signal out to a subsequent stage not shown that is positioned on a lower side in the drawing, originally, only a part of wiring lower than PIX_BLK is necessary; however, the wiring is extended in the part indicated by a broken line with respect to the configuration shown in FIG. 2. The same applies to pixels of Green. Therefore, between PD-PD of each color, the read lines of R and G are arranged, and a difference in structure per color is eliminated. As described, in the photoelectric conversion element, by forming wirings arranged between pixels of each color similarly in every color, a difference in shading per color is suppressed. Although wirings other than the read lines (R, G, B) that are necessary for explanation are not shown in FIG. 13, in an actual state, a power source, a GND, and various kinds of control lines are arranged.

Next, a configuration to suppress crosstalk between signal lines is explained. In the configuration shown in FIGS. 11A and 11B, to enlarge the opening on the M2 layer at a higher level, more wirings are arranged on the M1 layers at a lower level. Because multiple wirings are arranged on the M1 layer, crosstalk between wirings can be a problem. Particularly, as shown in FIG. 13, signal read lines from PIX_BLK are arranged between PD-PD, and a distance between wirings is generally set to a minimum width so as not to sacrifice an opening width. Therefore, an influence of crosstalk to an output image cannot be ignored.

Figure 14B:
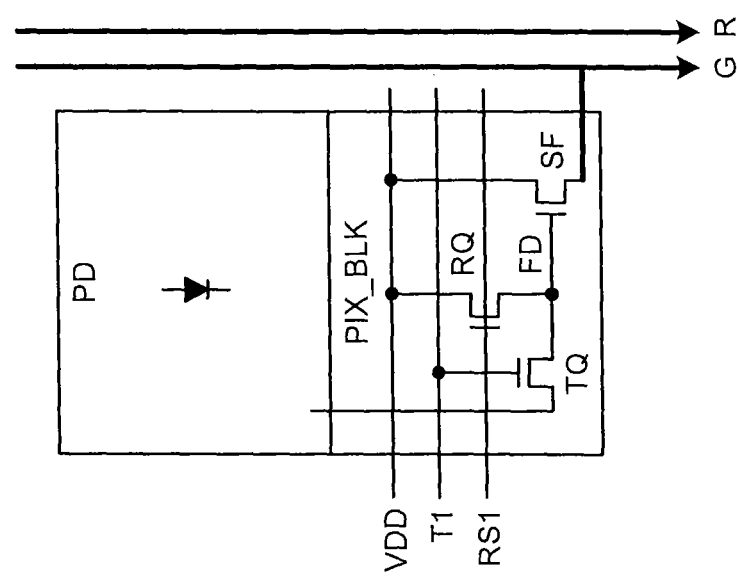
FIGS. 14A and 14B are diagrams illustrating read lines from a pixel, and a first configuration example that suppresses crosstalk in the read lines.
Figure 14A:
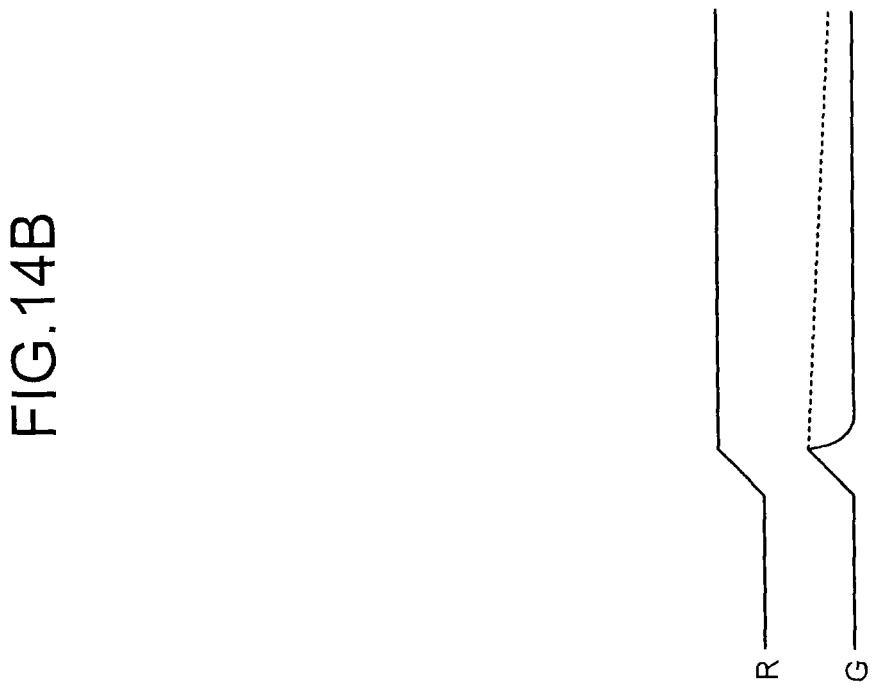

FIGS. 14A and 14B are diagrams illustrating read lines from a pixel, and a first configuration example that suppresses crosstalk in the read lines. As shown in FIG. 14A, an image signal output by a PD is buffered to be output to a signal read line. That is, the photoelectric conversion element is configured to read a buffered image signal. Specifically, as shown in FIG. 14A, in the photoelectric conversion element, a source follower (SF) is configured in PIX_BLK, and it is configured to read an output of this SF out to the read lines (R, G).

FIG. 14B depicts a changing state of signals in the configuration shown in FIG. 14A. As shown in FIG. 14B, when a signal level of an adjacent wiring (herein, R) to the read line (herein, G) changes, the change is superimposed also on G through a parasitic capacitance (crosstalk). However, the signal is returned to an original signal by the SF connected to the read line G, and then return to an original level of G. This can be understood that by a low impedance property of the SF, a response (to return to the original) of a signal in the read line becomes fast. In FIG. 14B, a dotted line indicates a changing state of a signal when the SF is not present, and the signal has not returned completely to the original level compared to the case with the SF. This can be a cause of intercolor crosstalk, and appears on an image as a mixed color or a false color.

As described, the photoelectric conversion element is configured to output a buffered signal to a read line between pixels, an influence of crosstalk is reduced. In the photoelectric conversion element being a CMOS linear image sensor, a read line is configured for every RGB (pixel). Accordingly, multiple wirings are arranged between pixels, and adjacent wirings are present, and therefore, crosstalk can be a problem. On the other hand, in an area sensor, line parallel processing (column processing) is common, and a signal of a pixel is read per row, and therefore, a wiring arranged between pixels is a single. That is, crosstalk as described above (particularly, intercolor crosstalk) is a linear sensor specific problem.

Moreover, even in the configuration shown in FIGS. 14A and 14B, considering that the responsiveness of the SF is limited, when PIX_BLK is operated at a high speed, just by reducing the impedance of the read line, reduction of crosstalk cannot be necessarily sufficient. FIGS. 15A to 15C are diagrams illustrating read lines from a pixel, and a second configuration example that suppresses crosstalk in the read lines. As shown in FIGS. 15A to 15C, the second configuration example in which crosstalk of the photoelectric conversion element is suppressed has a configuration in which a GND is sandwiched between an arbitrary read line and another signal line (FIG. 15A, 15B).

In the configuration shown in FIGS. 15A and 15B, the GND functions as a shield when viewed from the read line. As shown in FIG. 15C, when a signal level of an adjacent wiring (herein, R) changes to the read line (herein, G), the change is to be superimposed on the GND through a parasitic capacitance between the wirings. However, because the GND has a low impedance, the change is suppressed, and the change is not noticeable (alternately grounded). Therefore, even if a parasitic capacitance is present between the read line G and the GND, the change of the read line R is not transferred to G. That is, an influence of crosstalk is not transferred in the first place. A dotted line in FIG. 15C indicates the same state as the state explained in FIG. 14B.

Although in the configuration shown in FIGS. 15A to 15C, an example of sandwiching the GND between signal lines is shown, a similar effect can be obtained with a configuration in which a power source is sandwiched between signal lines. Moreover, to the wiring that is arranged on the M2 layer of FIG. 15B that is not shown in FIG. 15A, an arbitrary signal can be allocated.

FIGS. 16A to 16C are diagrams illustrating read lines from a pixel, and a third configuration example that suppresses crosstalk in the read lines. In the configuration shown in FIGS. 16A to 16C, crosstalk is suppressed without providing a specific wiring to suppress crosstalk. A CMOS linear image sensor can have a column configuration in which multiple pixels are processed by a signal processing circuit to increase a speed of operation. In this case, as for signals of a pixel and a pixel circuit (PIX_BLK), signals of RGB are simultaneously read to a column circuit, and thereafter, a signal is chronologically processed for one pixel at a time (FIG. 16A). At this time, in the column circuit (COL), a source follower (SF2) is configured, and a signal is output to a subsequent stage by the SF2, and in a circuit layout in which a subsequent circuit (refer to FIG. 17) such as PGA and ADC is arranged on a side across a pixel, an output signal line of the SF2 is required to be laid over the pixel.

In the configuration shown in FIGS. 16A and 16B, the signal line of the SF2 is arranged instead of the GND to suppress crosstalk shown in FIG. 15A. Because an output of the SF2 is a buffered signal, it is a signal having a low impedance similarly to the GND shown in FIGS. 15A to 15C. That is, the configuration shown in FIGS. 16A to 16C can suppress crosstalk between the read lines R-G similarly to the configuration shown in FIGS. 15A to 15C.

Although the signal line of the SF2 has a low impedance, it is a signal line unlike the power source and GND, and therefore, a signal change in the SF2 is to be superimposed on the read lines R and G (can be a cause of crosstalk). However, a period in which the read lines (R, G) become effective and a period in which the SF2 signal line becomes effective are different without overlapping with each other. Even if the signal line of the SF2 is superimposed on the read lines R and G, because the effective period of a signal of a pixel has been over, there is not influence to the effective signal of the pixel. On the other hand, even if crosstalk of the read lines R, G is superimposed on the signal line of the SF2, because the effective period of an output signal of the SF2 has been over, similarly, there is no influence thereto. That is, because the effective timings of operation of the read line and the SF2 differ from each other, even if crosstalk occurs in each, the influence does not cause a problem. Thus, by the signal line of the SF2, similarly to the GND shown in FIG. 15A, crosstalk is suppressed.

As described, in a CMOS linear image sensor having a column configuration, for example, crosstalk can be suppressed without providing specific power source and GND, by arranging a low impedance signal line that has originally been present therein, such as an output of the SF2, between read wirings.

Figure 17:
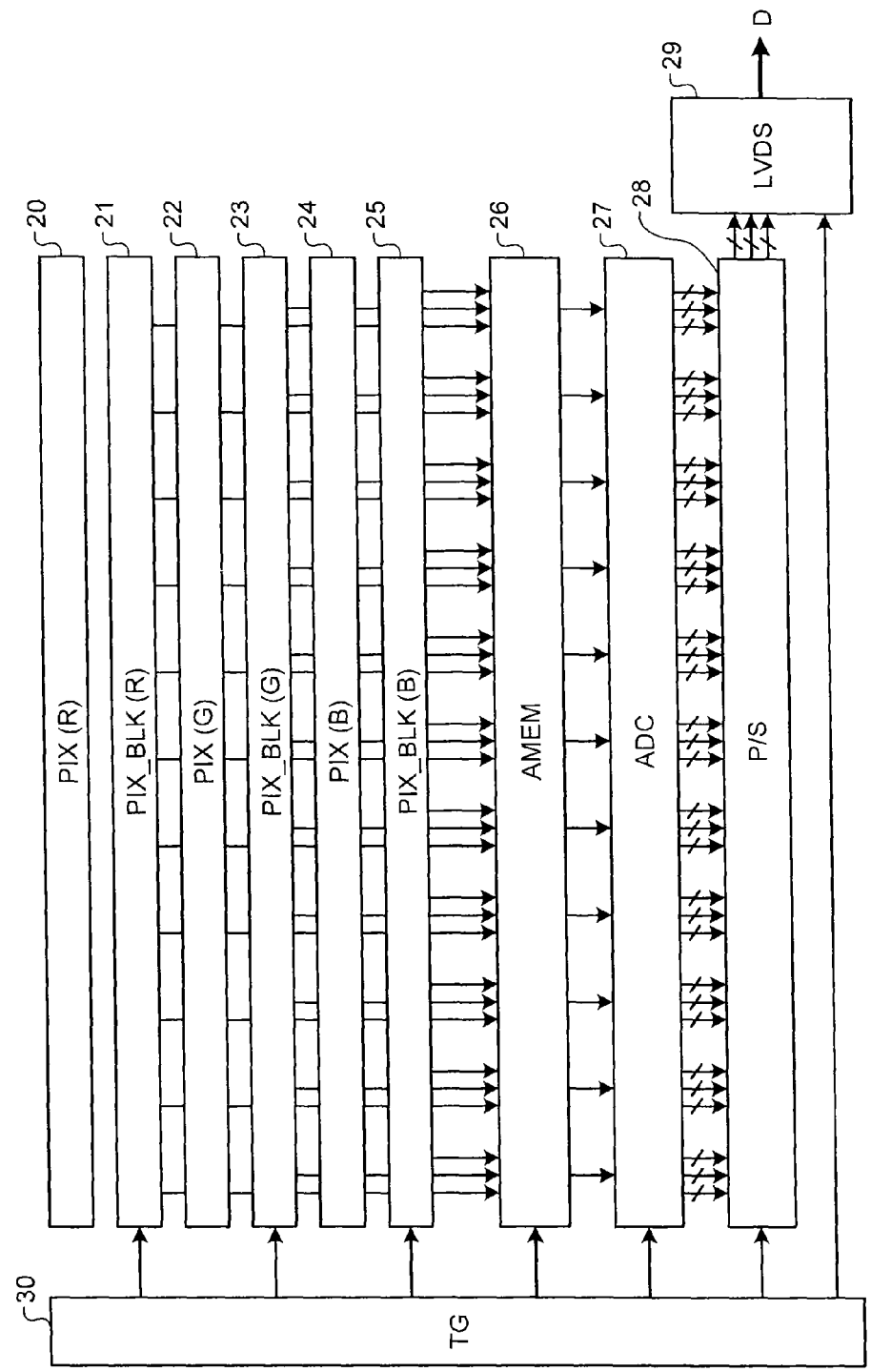
FIG. 17 is a diagram illustrating an exemplary entire configuration of a photoelectric conversion element.

FIG. 17 is a diagram illustrating an exemplary entire configuration of a CMOS linear image sensor (photoelectric conversion element) 40 in which the configuration described above is applied. A PIX(R) 20, a PIX(G) 22, and a PIX(B) 24 respectively have approximately 7000 pieces of PDs, and are configured per color of RGB. Moreover, a PIX_BLK(R) 21, a PIX_BLK(G) 23, and a PIX_BLK(B) 25 respectively have approximately 7000 pieces of pixel circuits (PIX_BLK), and are configured per color of RGB. That is, a pixel circuit (PIX_BLK) is provided in each of the PDs.

Each pixel circuit (PIX_BLK) converts an electric charge accumulated in a PD into a voltage signal, and outputs a signal to an analog memory through a read line. In a PIX_BLK, a transfer transistor that transfers an electric charge of a PD to an FD, a reset transistor that resets the FD, and a source follower transistor that buffers an FD voltage to output to a read line are configured. Linear sensors are different from area sensors, and a signal is independently read from each pixel of RGB, and therefore, a read line is present independently for each pixel.

An AMEM 26 has, for example, approximately 7000 pieces of analog memories for each color of RGB, and holds a signal per pixel, and successively outputs an image signal in a column unit. By holding a signal by this AMEM 26, a global shutter mode in which operation timing of PIX and PIX_BLK, that is, exposure timing coincides with each other among RGB is implemented. The SF2 described above using FIGS. 16A to 16C is configured on an output side of the AMEM 26, for example.

An ADC 27 includes the same number of analog/digital (AD) converters as the number of columns, and successively performs AD conversion on an image signal in a column unit. The ADC 27 performs parallel processing by having the same number of AD converters as the number of columns, thereby achieving high speed processing as the photoelectric conversion element while suppressing an operation speed of the AD converter.

A signal subjected to the AD conversion by the ADC 27 is held by a parallel-serial converter (P/S) 28 per pixel, and the held signal is successively output to an LVDS 29. The photoelectric conversion element 40 processes parallel data that has been obtained by performing parallel processing on respective pixels in the main scanning direction on an upstream side to the P/S 28, and processes serial data of each color of RGB in a downstream side to the P/S 28. A signal output by the P/S 28 is converted to a low-voltage-differential serial signal by the LVDS 29, and outputs to a subsequent stage. A timing control unit (TG) 30 controls respective parts constituting the photoelectric conversion element 40.

Figure 18:
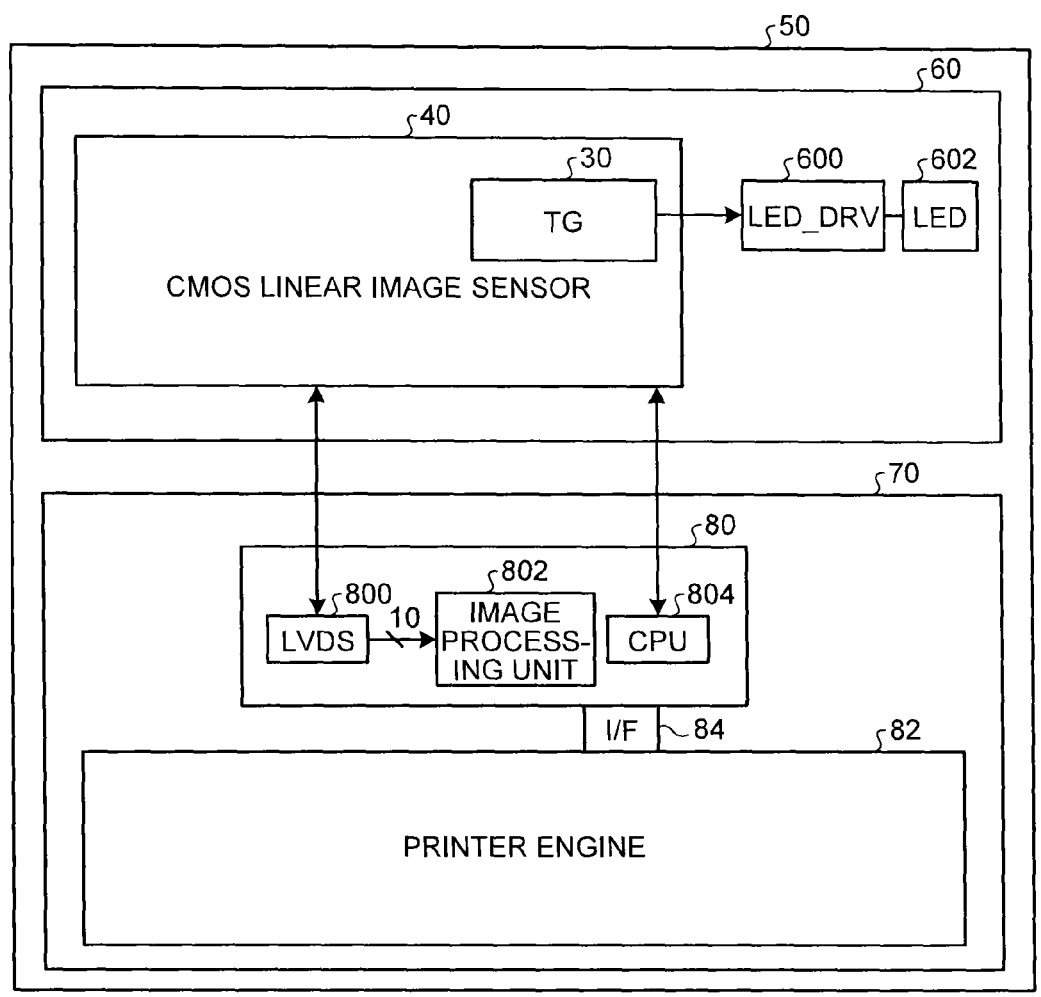
FIG. 18 is a diagram illustrating an overview of an image forming apparatus that is equipped with an image reading device that includes the photoelectric conversion element.

Next, an image forming apparatus that is equipped with the image reading device including the photoelectric conversion element is explained. FIG. 18 depicts an overview of an image forming apparatus 50 that is equipped with, for example, an image reading device 60 that includes the photoelectric conversion element 40. The image forming apparatus 50 is, for example, a copier, a multifunction peripheral (MFP), and the like that includes the image reading device 60 and an image forming unit 70.

The image reading device 60 includes, for example, the photoelectric conversion element 40, a light-emitting diode (LED) driver (LED_DRV) 600, and an LED 602. The LED driver 600 drives the LED 602 synchronizing with a line synchronization signal output by the timing control unit (TG) 30 and the like. The LED 602 irradiates light to an original. The photoelectric conversion element 40 synchronizes with the line synchronization signal and the like to receive reflected light from the original, and PDs not shown generate an electric charge and starts accumulation thereof. The photoelectric conversion element 40 performs AD conversion, parallel serial conversion, and the like, and then outputs image data to the image forming unit 70.

The image forming unit 70 includes a processing unit 80 and a printer engine 82, and the processing unit 80 and the printer engine 82 are connected to each other through an interface (I/F) 84.

The processing unit 80 includes an LVDS 800, an image processing unit 802, and a central processing unit (CPU) 804. The CPU 804 controls respective parts constituting the image forming apparatus 50 such as the photoelectric conversion element 40. Moreover, the CPU 804 (or the timing control unit 30) controls the respective PDs to start generation of electric charges according to a light reception amount at substantially the same time.

The photoelectric conversion element 40 outputs, for example, image data that is read by the image reading device 60, a line synchronization signal, a transfer clock, and the like to the LVDS 800. The LVDS 800 converts the accepted image data, the line synchronization signal, the transfer clock, and the like into parallel 10-bit data. The image processing unit 802 performs image processing using the converted 10-bit data, and output image data and the like to the printer engine 82. The printer engine 82 performs printing using the accepted image data.

As described, in the photoelectric conversion element according to the embodiment, a photodetector is formed such that the first shaded region and the second shaded region in which light is shaded by wirings positioned on a straight line sandwiching an opening, respectively, when light that has passed through the opening that opens being sandwiched by the wirings positioned on the straight line is incident perpendicularly on a light receiving surface of the photodetector. And, therefore, unevenness in an amount of light received by respective pixels can be suppressed without limiting an optical system applicable to incidence of light.

According to the embodiments of the present invention, an effect is produced that unevenness in an amount of light received at each pixel is reduced without limiting an optical system that is used for incidence of light.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A photoelectric conversion element comprising:
a plurality of photodetectors that perform photoelectric conversion per pixel to output an analog image signal, and that are arranged on a straight line; and
wirings that are formed on a wiring layer, and that are enabled to be used as at least one of a signal line used in a peripheral circuit of the photodetector, a power source, and a ground, wherein
the photodetector is formed to have a first shaded region and a second shaded region in which light is shaded by the wirings that are positioned on the straight line sandwiching an opening, respectively, when light that has passed through the opening that opens being sandwiched by the wirings positioned on the straight line is incident perpendicularly on a light receiving surface of the photodetector.

2. The photoelectric conversion element according to claim 1, wherein
the photodetector is formed such that, even when light is entered in either one of the first shaded region and the second shaded region because of that light passed through the opening is incident on the light receiving surface in an inclined manner, an amount of light substantially equals to an amount of light when light passed through the opening is incident perpendicularly on the light receiving surface.

3. The photoelectric conversion element according to claim 1, wherein
the wirings are formed on a plurality of wiring layers, and form the opening on each of the wiring layers, and the opening that is positioned farther from the photodetector has a wider opening width.

4. The photoelectric conversion element according to claim 1, wherein
the peripheral circuit includes a pixel circuit that buffers a signal output from the photodetector to output, and
at least one of the wirings is a signal line that transmits a signal output from the pixel circuit.

5. The photoelectric conversion element according to claim 4, wherein
the wiring that is enabled to be used as any one of the power source and the ground is formed adjacent to the signal line that transmits a signal output from the pixel circuit.

6. The photoelectric conversion element according to claim 4, wherein
a plurality of signal lines that transmit signals output from a plurality of units of the pixel circuit are formed in an adjacent manner.

7. The photoelectric conversion element according to claim 1, wherein
either ones of the wirings that are formed between the pixels arranged in a direction substantially parallel to the straight line are arranged substantially similarly to each other.

8. The photoelectric conversion element according to claim 1, wherein
the photodetectors are arranged in one direction per color of light to be received.

9. An image reading device comprising the photoelectric conversion element according to claim 1.

10. An image forming apparatus comprising:
the image reading device according to claim 9; and
an image forming unit that forms an image read by the image reading device.

* * * * *